Dec. 5, 1961 TAKASHI KUBOTA 3,012,136

DETECTING AND AUTOMATIC GAIN CONTROLLING CIRCUIT ARRANGEMENT USING TRANSISTORS

Filed March 17, 1960

3,012,136
Patented Dec. 5, 1961

3,012,136

DETECTING AND AUTOMATIC GAIN CONTROLLING CIRCUIT ARRANGEMENT USING TRANSISTORS

Takashi Kubota, Yokohama City, Japan, assignor to Hitachi Limited, Tokyo, Japan
Filed Mar. 17, 1960, Ser. No. 15,660
Claims priority, application Japan Nov. 24, 1959
1 Claim. (Cl. 250—20)

The present invention relates to detecting and automatic-gain-control (AGC) transistor circuits of the superheterodyne type.

It is necessary, in detector circuits of superheterodyne type, that the linearity of the output signals and AGC voltage be maintained with regard to the input signals, and it is also necessary that, in order to maintain sufficient AGC action, a large AGC voltage be generated even when the input signal of the AGC circuit is small.

In known detector and AGC circuits using convention diodes for detection, there is used a system wherein a part of the detected D.C. output is applied to the base of the controlling transistor as a controlling signal to change emitter current, thereby controlling the gain of the transistor. In this system the signal applied to the diode is small and the detected output and AGC output are small so that the AGC effect is not sufficient and the distortion of the detected signals is comparatively large. The system has the further disadvantage that the emitter current varies considerably owing to temperature change or interchange of transistors and also the sensitivity of the set is not stable.

An object of this invention is to obviate the above defects.

For a better understanding of this invention, reference is had to the accompanying drawings, in which.

Figures 1, 2, 3:
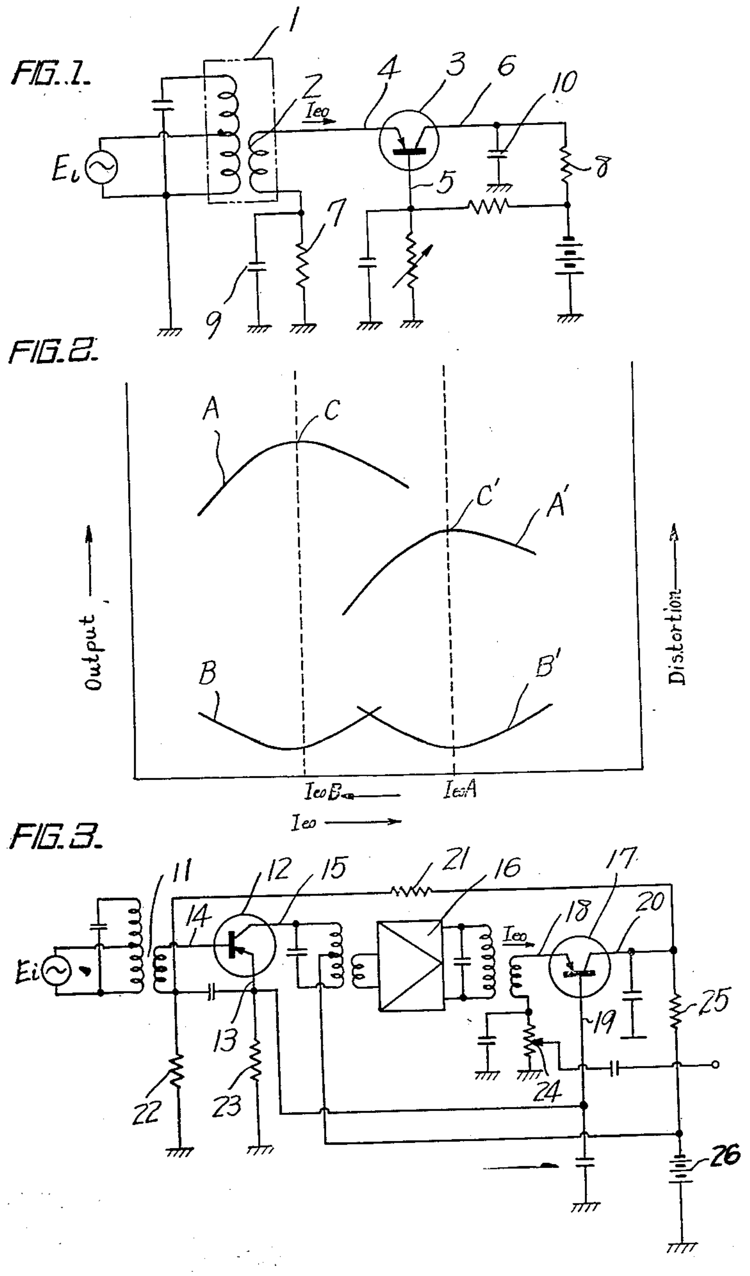
FIG. 1 is a diagram of detector circuit using a transistor according to this invention.
FIG. 2 shows curve diagrams for illustrating the detecting characteristics.
FIG. 3 is a connection diagram for illustrating an automatic gain control circuit arrangement embodying this invention.

Referring to FIG. 1, 1 represents an intermediate frequency transformer and 2 is its secondary coil, 3 a detecting transistor consisting of emitter 4, base 5 and collector 6. 7 and 8 represent resistors, and 9 and 10 condensers.

The input signal is applied from the secondary coil 2 of the intermediate frequency transformer 1 between the emitter 4 of transistor 3 and ground and is detected by the junction diode part between base 5 and emitter 4. The output is the voltage drop resulting from the detected current flowing through the load resistance 7. The D.C. output for AGC is amplified and appears as a voltage drop across resistor 8. Condenser 9 by-passes only the carrier frequency of the input signal. The condenser 10 has a large capacity such as 3 to 10 μF and, if the input signal component and the audio frequency component are by-passed thereby, the output of audio frequency signal appearing across the load resistor 7 becomes maximum and the distortion is very small. In such a circuit, the detection gain and the distortion of detected signals vary according to the value of the emitter current $I_{eo}$ at the time of zero signals and there exist optimum points C and C′ as shown by curves A, A′ and B, B′ in FIG. 2. The maximum detected output corresponds to the point of minimum distortion of the detected signals. The optimum point of emitter bias current, $I_{eo}$, is also shifted according to the strength of input signal and when the input signal is small the current will have a comparatively large value, $I_{eo}$A, while if the input signal is large it is shifted to a point of comparatively small value, $I_{eo}$B.

FIG. 3 is a circuit arrangement for detecting and automatic gain control using transistors constructed in accordance with the above characteristics of this invention.

Referring to FIG. 3, 11 represents an intermediate frequency transformer, 12 a controlling transistor consisting of emiter 13, base 14 and collector 15. 16 represents an amplifier, 17 a detecting transistor consisting of emitter 18, base 19 and collector 20. 21, 22, 23, 24 and 25 are resistors and 26 a D.C. voltage source. Resistors 21, 22, 23, 24 and 25 are selected so that when the voltage $E_i$ of the input signal is zero the controlling transistor 12 and detecting transistor 17 will assume a normal bias current value.

When the input signal voltage $E_i$ is applied to the input side of controlling transistor 12 through intermediate frequency transformer 11 the input signal is amplified by controlling transistor 12 and amplifier 16 and applied between emitter 18 and base 19 of detecting transistor 17. The detected output signals of the audio frequency components are tapped from the resistor 24, while the D.C. component is amplified at collector 20 to increase the collector current. The voltage drop across resistor 25 becomes larger and the potential of collector 20 approaches ground potential so that the potential of base 14 of controlling transistor 12 also approaches the ground potential and accordingly the emitter current of controlling transistor 12 is reduced and the degree of amplification is lowered. That is, an AGC circuit of high loop gain is established so that it shows very favorable AGC characteristics. Also owing to the decrease of emitter current the voltage drop across resistor 23 is reduced and the bias potential of the base of detecting transistor 17 drops so that the emitter bias current $I_{eo}$ becomes smaller and approaches the value showing the optimum point of detection gain and the distortion of detected signals as shown in FIG. 2. Accordingly, in spite of the fact that the voltage $E_i$ of the input signal is large or small the value of the emitter bias current of detecting transistor 17 can be maintained automatically at the best value. Since controlling transistor 12 and detecting transistor 17 establish a negative feed back circuit from the point view of direct current very good stability is assured even when temperature change occurs or a transistor is changed. For example, the stability S of a transistor with respect to temperature change may be defined by $$S=\frac{\partial I_c}{\partial I_{co}}$$

where $I_c$ represents collector current and $I_{co}$ represents a D.C. collector cutoff current.

Here, values of each resistors 21, 22, 23, 24 and 25 and the battery source 26 are taken as follows:

| | |
|---|---|
| Resistor 21 | 22 KΩ |
| Resistor 22 | 10 KΩ |
| Resistor 23 | 680 Ω |
| Resistor 24 | 5 KΩ |
| Resistor 25 | 27 KΩ |
| Voltage of battery source | 4.5 v. |

If the stability is calculated from the above values, then

The stability S of controlling transistor 12=1.67
The stability S of detecting transistor 17=2.73

Such results show very splendid values if compared with the stability $S$=7 to 10 of the controlling transistor circuit in conventional detecting and AGC circuits using known diodes.

As described in the foregoing the present invention has the advantage of greatly improving AGC characteristics, distortion characteristics and stability by using a transistor in a conventional detecting and AGC circuit where diodes have heretofore been used.

What I claim is:

A detecting and automatic gain control circuit comprising first and second transistors, each having an emitter, a collector and a base, a first resistor for coupling the emitter of said first transistor to ground, signal input means coupled to the base of said first transistor for receiving an input signal, first signal output means coupled to the collector of said first transistor, a source of potential, means for applying said source of potential to the colector of said first transistor, means for alternating current signal coupling the base of said second transistor to ground, means for connecting the base of said second transistor to the emitter of said first transistor whereby the current flow through said first transistor controls the base bias of said second transistor, signal input means including a second resistor and a capacitor connected to the emitter of said second transistor for receiving signals from said first signal output means, the junction of the emitter and the base of said second transistor and said second resistor and capacitor comprising a detector means, a third resistor for connecting the collector of said second transistor to said source of operating potential, means for bypassing alternating current signals at the collector of said second transistor to ground, feedback means for feeding direct current signals from the collector of said second transistor to the base of said first transistor to control the gain of said first transistor, and output means connected to said second resistor for transmitting output signals.

References Cited in the file of this patent

UNITED STATES PATENTS

| | | |
|---|---|---|
| 2,841,702 | Barton | July 1, 1958 |
| 2,891,145 | Bradmiller | June 16, 1959 |
| 2,891,146 | Sciurba | June 16, 1959 |